US012764909B2

(12) United States Patent
Prats et al.

(10) Patent No.: US 12,764,909 B2
(45) Date of Patent: Oct. 13, 2026

(54) EXPANDABLE BLANKING PANEL ASSEMBLY FOR AISLES IN DATA CENTERS AND SIMILAR FACILITIES

(71) Applicant: TATE ACCESS FLOORS, INC., Jessup, MD (US)

(72) Inventors: Brian Prats, Baltimore, MD (US); Alex Ren, Baltimore, MD (US); Gwen Demosky, Ellicott City, MD (US); Daniel Kennedy, Lovettsville, VA (US)

(73) Assignee: TATE ACCESS FLOORS, INC., Jessup, MD (US)

( * ) Notice: Subject to any disclaimer, the term of this patent is extended or adjusted under 35 U.S.C. 154(b) by 99 days.

(21) Appl. No.: 18/541,801

(22) Filed: Dec. 15, 2023

(65) Prior Publication Data

US 2025/0203821 A1 Jun. 19, 2025

(51) Int. Cl.
*H05K 7/20* (2006.01)
*H05K 7/18* (2006.01)

(52) U.S. Cl.
CPC ........... *H05K 7/20709* (2013.01); *H05K 7/18* (2013.01)

(58) Field of Classification Search
CPC ........................................................ H05K 5/00
See application file for complete search history.

(56) References Cited

U.S. PATENT DOCUMENTS

| | | | | |
|---|---|---|---|---|
| 7,438,638 B2 * | 10/2008 | Lewis, II | ............. | H05K 9/0041 361/679.48 |
| 2012/0112612 A1 | 5/2012 | Krietzman | | |
| 2012/0181906 A1 | 7/2012 | Caveney | | |

FOREIGN PATENT DOCUMENTS

| | | |
|---|---|---|
| EP | 2 728 080 A1 | 5/2014 |
| JP | 2021-34421 A | 3/2021 |
| JP | 7324185 B2 | 8/2023 |

OTHER PUBLICATIONS

Mar. 27, 2026 Office Action issued in Philippine Application No. 1/2024/050851.
Apr. 10, 2025 Extended European Search Report issued in European Patent Application No. 24211226.6.
Jul. 1, 2026 Office Action issued in Korean Application No. 10-2024-0183292.

* cited by examiner

*Primary Examiner* — Jerry Wu
(74) *Attorney, Agent, or Firm* — Oliff PLC

(57) ABSTRACT

A expandable panel assembly that provides an air barrier in a row of server racks in a data center or similar facility in spaces in the row that are not occupied by a server rack. The expandable panel assembly includes a base panel assembly and a slidable panel assembly. The base panel assembly and the slidable panel assembly are configured such that the slidable panel assembly can be slid along the base panel assembly between retracted (non-extended) and extended positions. The base panel assembly includes a channel member with first and second channels. The slidable panel assembly is slidably retained in one of those channels.

4 Claims, 8 Drawing Sheets

EXPANDABLE BLANKING PANEL ASSEMBLY FOR AISLES IN DATA CENTERS AND SIMILAR FACILITIES

FIELD OF THE INVENTION

This invention relates to apparatus that forms hot and cold aisles between and above rows of server racks in data centers and similar facilities. More specifically, this invention relates to panel assemblies that can be utilized in those rows in spaces where there are no server racks and above the server racks to prevent the intermixing of air in the hot and cold aisles through those spaces.

BACKGROUND OF THE INVENTION

Data centers typically include rows of server racks that house or otherwise support servers and other computer and electronic equipment. Each server rack can house or otherwise support a variety of servers and other computer and electronic equipment.

Those servers and that other computer and electronic equipment require relatively high amounts of energy to operate, which generate heat. If that heat is not dissipated, equipment malfunctions may occur due to overheating.

Typically, to reduce the risk of excessive and possibly damaging heat in the rows of server racks, each row has a cold aisle on one side of the row, usually the front side, and a hot aisle on the other side of the row, usually the back side. The server racks function as the "barrier" between the hot aisle and the cold aisle.

Cooling air is usually directed (1) to the cold aisle, (2) from the cold aisle through the row of server racks, from the front to the back of the server racks, to the hot aisle and (3) out of the hot aisle, either out of the data center or to be recycled as "new" cooling air and then re-circulated within the data center.

However, often, the rows of server racks may have "blank" spaces, i.e., spaces that are not occupied by a server rack filled with servers and other computer and electronic equipment. If those "blank" spaces are not filled, hot air in the hot aisle can mix with the cooling air in the cold aisle through those spaces, thus reducing the thermal efficiency of the aisles.

Thus, for the cold/hot aisles to function at a high thermal efficiency, it is desirable that something be placed or inserted in those "blank" spaces in the server rack rows that prevents mixing of hot air and cooling air through those spaces.

There are certain panels in the art that are intended to be placed or inserted in those "blank" spaces to block air flow through those spaces. All of those panels have a fixed height and width.

However, the "blank" spaces in the rows of server racks in a particular data center or similar facility, or in different data centers and similar facilities, may have different heights and widths. Thus, a one-size panel will not sufficiently block air flow through all of those "blank" spaces.

Thus, there is a need for blanking panel assemblies for data centers and similar facilities whose height or width can be adjusted in the field to the various heights and widths of the "blank" spaces in the server rack rows of the data centers and similar facilities.

In addition, often, there is a blank space above the rows of server racks, i.e., between the rows of server racks and the ceiling, with no barrier between the cold and hot aisles. Thus, there is also a need for a panel assembly that can be used in those spaces to extend the cold/hot aisle barriers or dividers above the rows of server racks.

SUMMARY OF THE INVENTION

The blanking panel assemblies of this invention address the above needs with regard to rows of server racks and cold/hot aisles in data centers and similar facilities and other needs in that art that are apparent to those skilled in the art given this disclosure.

Specifically, the expandable panel assemblies of some embodiments of this invention include a base panel assembly and a slidable panel assembly. The base panel assembly and the slidable panel assembly are configured such that the slidable panel assembly can be slid along the base panel assembly between retracted and extended positions. The base panel assembly may include a first air impervious panel, a first base panel channel member and a second base panel channel member. The slidable panel assembly may include a second air impervious panel, a first slidable panel channel member and a second slidable panel channel member. The first base panel channel member may have first and second channels. An edge of the first air impervious panel may be received and retained in the first channel. An edge of the second air impervious panel may be retained in the first slidable panel channel member. The slidable panel assembly may be slidably retained in the second channel. The second base panel channel member may be configured to be attached to a member or structure of the data center or similar facility, including an access or raised floor, and the second slidable panel channel member may be configured to be attached to another member or structure of the data center or similar facility.

In certain embodiments of this invention, the first base panel channel member may include a base wall and outer, middle and inner flange walls that (1) extend from the base wall in the same direction and (2) are parallel. The first channel may be defined by the outer and middle flange walls and the second channel may be defined by the middle and inner flange walls.

In other embodiments of the invention, the first base panel channel member may be an integral, one-piece member.

In further embodiments of the invention, the outer flange wall and the middle flange wall may have fingers that extend towards each other and are configured to slidably engage the slidable panel assembly.

This invention has many advantages and benefits, including that the panel assemblies of the invention are scalable height-wise or width-wise to conform to different sized blank spaces in server rack rows in data rooms and similar facilities.

BRIEF DESCRIPTION OF THE FIGURES

FIG. 7B shows a panel received in the channel member.

FIG. 8B shows a panel received in the channel member.

FIG. 9B shows a panel of the base panel assembly and a top panel assembly received in the channel member.

DETAILED DESCRIPTION OF THE FIGURES

One embodiment of an expandable blanking panel assembly of this invention, expandable blanking panel assembly 20, is illustrated in the FIGS. 1-9B.

In this embodiment of the invention, expandable blanking panel assembly 20 includes base or lower panel assembly 22 and top or slidable panel assembly 24. Top panel assembly 24 is slidable in the up/down direction relative to base panel assembly 22 between at least lowered (or retracted) and extended positions, as explained below.

Figure 1:
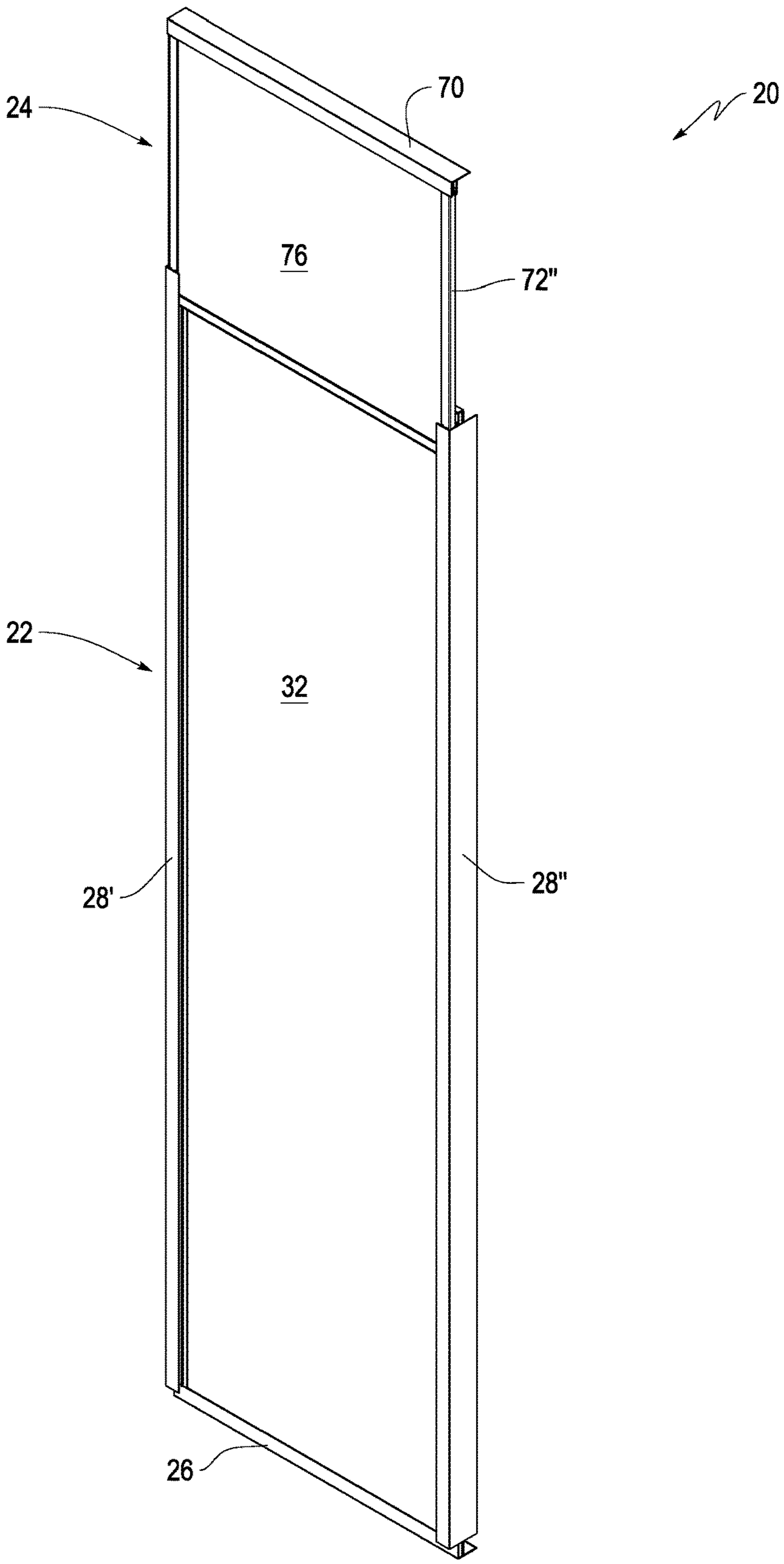
FIG. 1 is a perspective view of an expandable blanking panel assembly of one embodiment of this invention, illustrating the panel assembly in its extended state.
Figure 2:
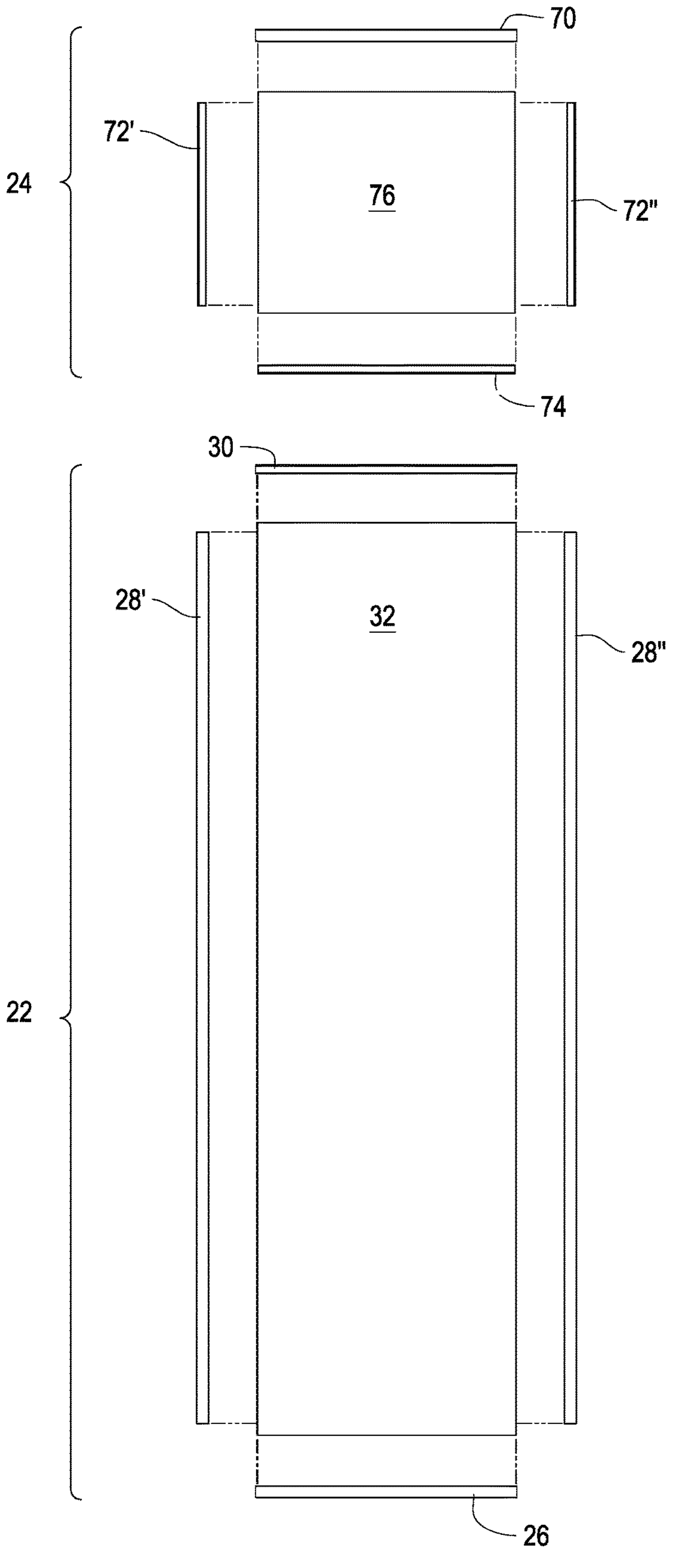
FIG. 2 is a front, exploded view of the expandable blanking panel assembly illustrated in FIG. 1.
Figure 3:
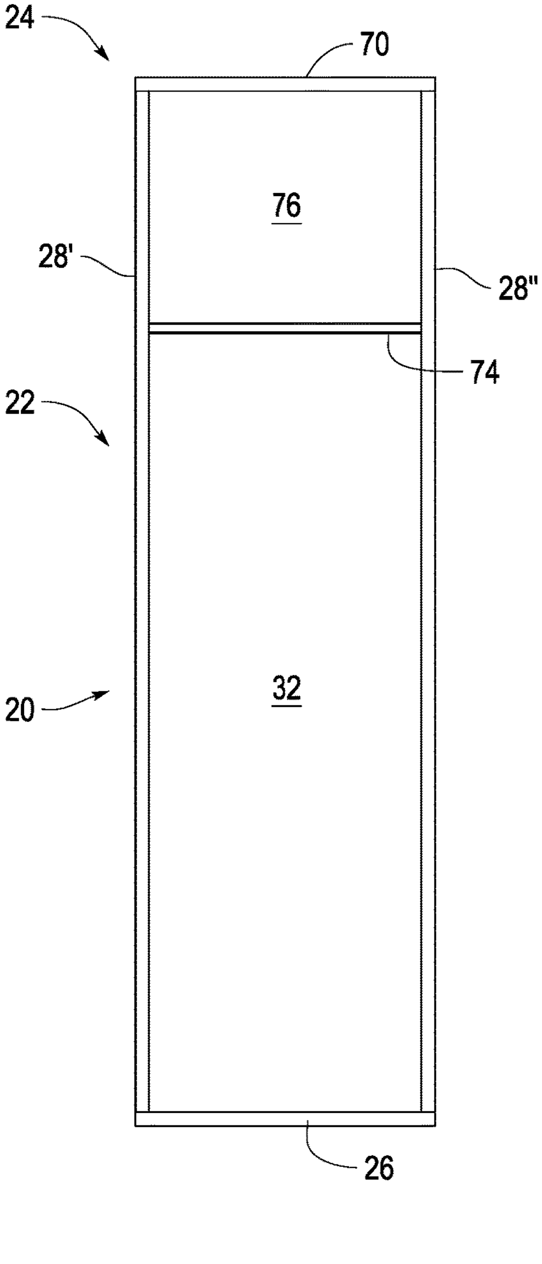
FIG. 3 is a front view of the expandable blanking panel assembly illustrated in FIGS. 1 and 2, illustrating the panel assembly in its lowered or retracted state.
Figure 4:
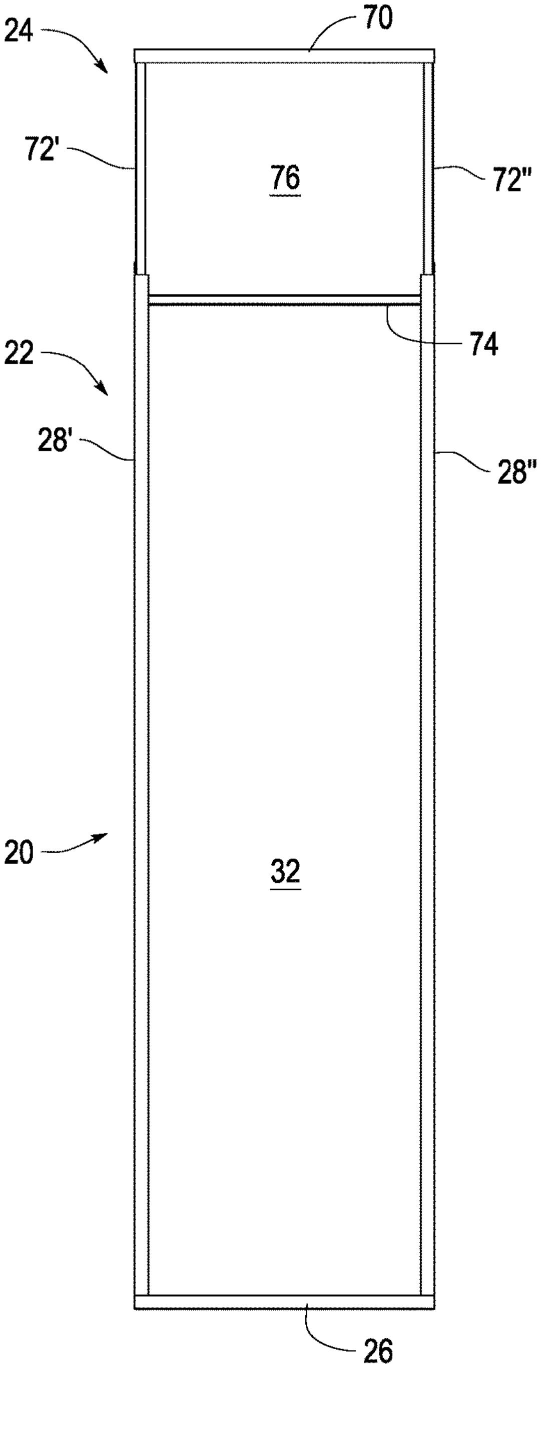
FIG. 4 is a front view of the expandable blanking panel assembly illustrated in FIGS. 1-3, illustrating the panel assembly in its extended state.
Figure 5A:
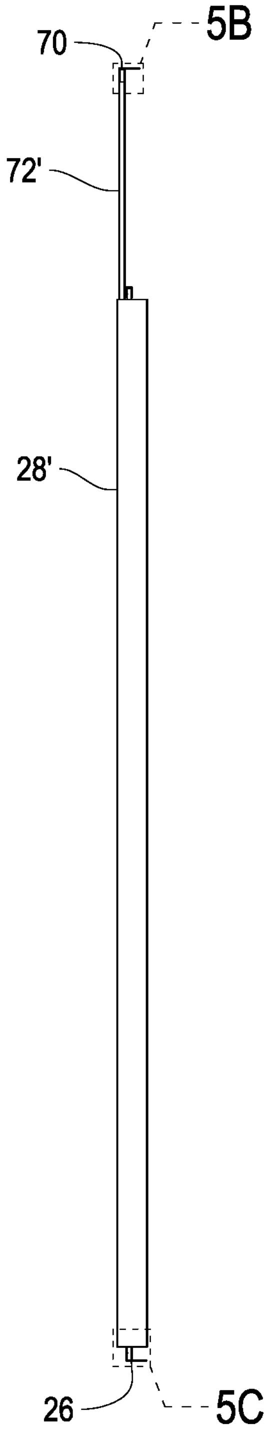
FIG. 5A is a side view of the expandable blanking panel assembly illustrated in FIGS. 1-4, illustrating the panel assembly in its extended state.
Figure 5B:
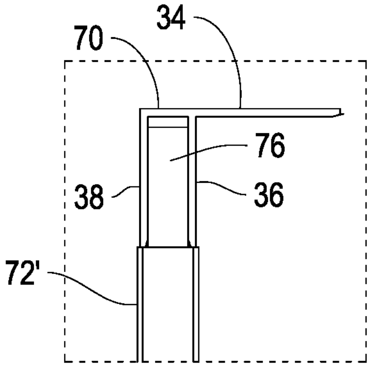
FIGS. 5B and 5C are enlarged views of boxes 5B and 5C in FIG. 5A.
Figure 5C:
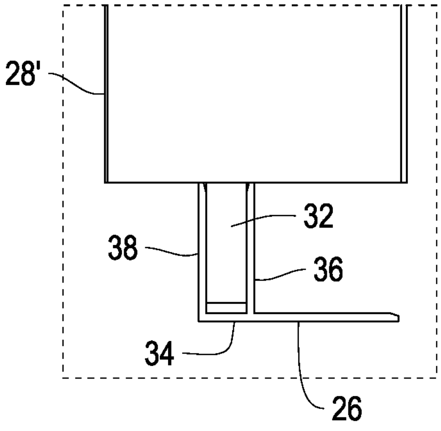
Figure 6:
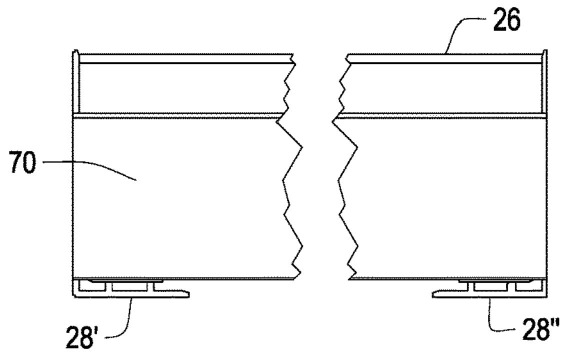
FIG. 6 is a top view of the expandable blanking panel assembly illustrated in FIGS. 1-5C.

Base panel assembly 22 includes bottom channel member 26, side channel members 28' and 28", top channel member 30 and panel 32, as shown in, inter alia, FIG. 2.

Figure 7A:
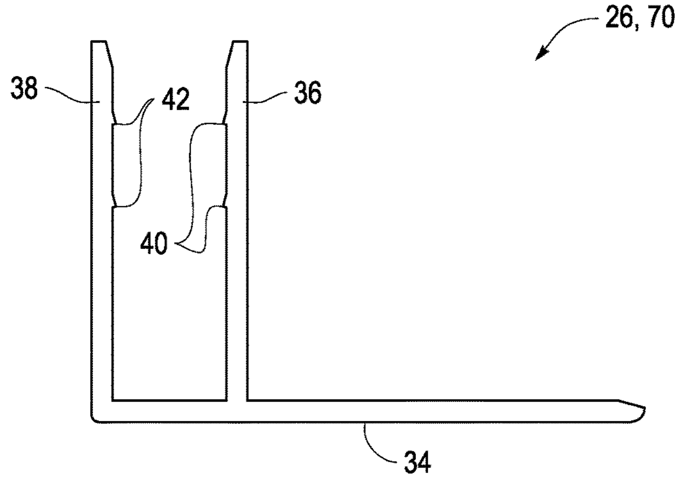
FIGS. 7A and 7B are side views of the bottom channel member of the base panel assembly and the top channel member of the top panel assembly of the expandable blanking panel assembly illustrated in FIGS. 1-6.
Figure 7B:
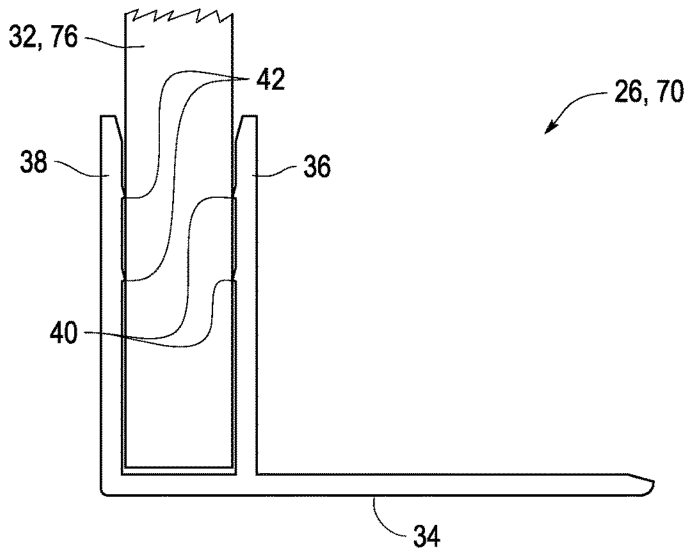

In this embodiment of the invention, bottom channel number 26 has an F-shaped profile and includes base wall 34 and flange walls 36 and 38, as shown in FIGS. 7A and 7B. Flange walls 36 and 38 extend from base wall 34 and are parallel. Flange wall 36 includes pointed protrusions or knobs 40 and flange wall 38 includes pointed protrusions or knobs 42. Pointed protrusions or knobs 40 and 42 face each other.

Figure 9A:
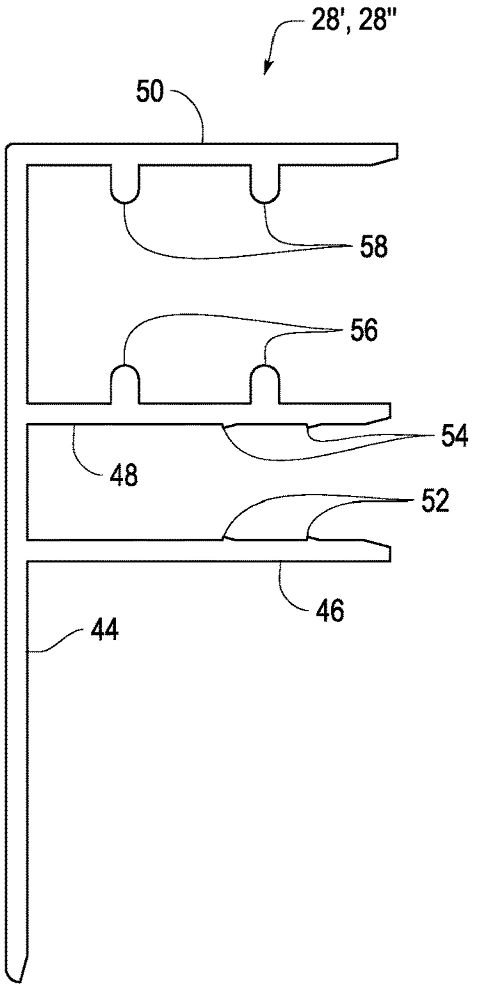
FIGS. 9A and 9B are top views of the side channel members of the base panel assembly of the expandable blanking panel assembly illustrated in FIGS. 1-6.
Figure 9B:
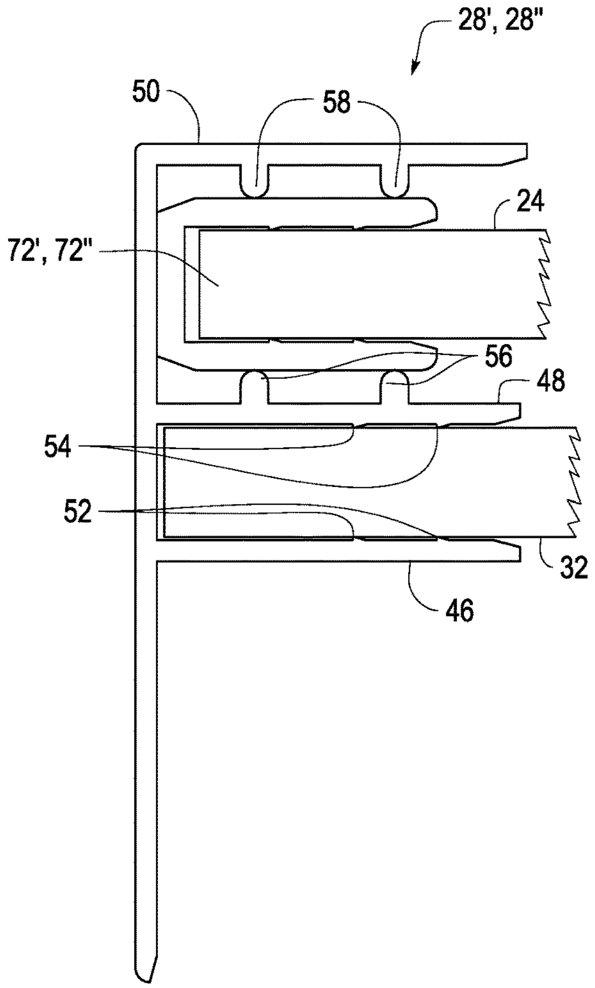

Also in this embodiment of the invention, side channel members 28' and 28" each include base wall 44, inner flange wall 46, middle flange wall 48 and outer flange wall 50, as shown in FIGS. 9A and 9B. Flange walls 46, 48 and 50 extend from base wall 44 and are parallel. Inner flange wall 46 includes pointed protrusions or knobs 52 on the surface of inner flange wall 46 facing middle flange wall 48. Pointed protrusions or knobs 52 extend toward middle flange wall 48. Middle flange wall 48 includes pointed protrusions or knobs 54 and fingers 56. Pointed protrusions or knobs 54 are on the surface of middle flange wall 48 facing inner flange wall 46 and extend toward inner flange wall 46. Fingers 56 are on the opposite surface of middle flange wall 48 and extend toward outer flange wall 50. Outer flange wall 50 has fingers 58 on the surface of outer flange wall 50 facing middle flange wall 48. Fingers 58 extend toward middle flange wall 48.

In some embodiments of this invention, only one of side channel members 28' and 28" may have the above configuration. The other of side channel members 28' and 28" can have the shape of channel member 30, discussed below, or any other suitable shape.

Figure 8A:
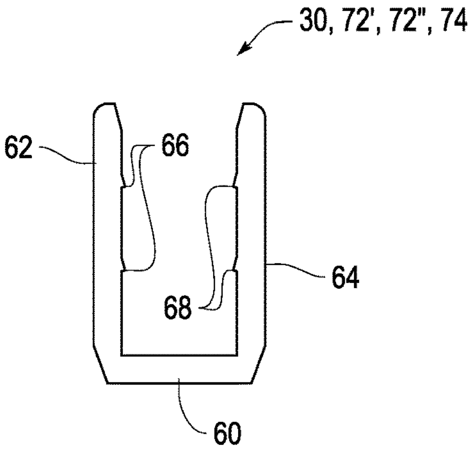
FIGS. 8A and 8B are side views of the top channel member of the base panel assembly and the side channel members of the top panel assembly of the expandable blanking panel assembly illustrated in FIGS. 1-6.
Figure 8B:
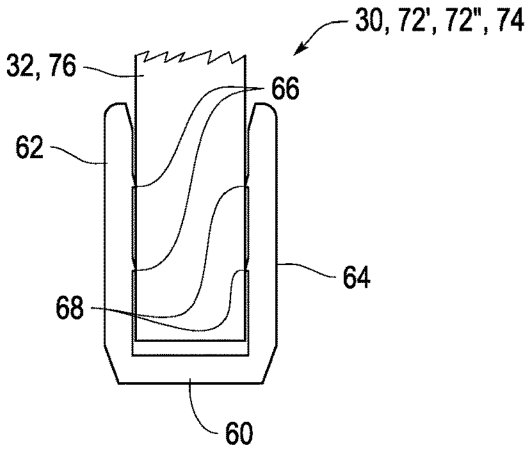

In this embodiment of the invention, top channel member 30 has a U-shape with base wall 60 and side walls 62 and 64, as shown in FIGS. 8A and 8B. Side walls 62 and 64 extend from base wall 60 and are parallel. Side wall 62 has pointed protrusions or knobs 66 that extend from the surface of side wall 62 facing side wall 64 toward side wall 64. Side wall 64 has pointed protrusions or knobs 68 that extend from the surface of side wall 64 facing side wall 62 toward side wall 62.

Also in this embodiment of the invention, panel 32 is a flat panel that is air impervious and has thermal capability. One example of panel 32 is a multiwall polycarbonate panel.

Bottom channel member 26, side channel members 28' and 28" and top channel member 30 abut at their respective ends to form a "frame" for panel 32. Panel 32 is retained by bottom channel member 26, side channel members 28' and 28" and top channel member 30, i.e., in the "frame," by having (1) its bottom edge retained between pointed protrusions or knobs 40 and 42 of flange walls 36 and 38, respectively, of bottom channel member 26, as shown in FIG. 7B, (2) its side edges retained between pointed protrusions or knobs 52 and 54 of inner flange wall 46 and middle flange wall 48, respectively, of side channel members 28' and 28", as shown in FIG. 9B, and (3) its top edge retained between pointed protrusions or knobs 66 and 68 of side walls 62 and 64, respectively, of top channel member 30, as shown in FIG. 8B.

While in this embodiment of the invention, the "frame" of base panel assembly 22 includes bottom channel member 26, side channel members 28' and 28" and top channel member 30, the base panel assemblies of other embodiments of this invention can include other structural members, as long as those other structural members provide the necessary structural integrity.

Also, while, in this embodiment of the invention, bottom channel member 26, side channel members 28' and 28" and top channel member 30 are retained in the "frame" shape by the frictional engagement of the edges of panel 32 with (1) pointed protrusions or knobs 40 and 42 of flange walls 36 and 38, respectively, of bottom channel member 26, (2) pointed protrusions or knobs 52 and 54 of inner wall 46 and middle flange wall 48, respectively, of side channel members 28' and 28", and (3) pointed protrusions or knobs 66 and 68 of side walls 62 and 64, respectively, of top channel member 30, in other embodiments, the respective ends of those members may be connected, for example, by welding.

In this embodiment of the invention, top panel assembly 24 includes top channel member 70, side channel members 72' and 72", bottom channel member 74 and panel 76, as shown in, inter alia, FIG. 2.

Top channel member 70 is the same as base channel member 26 of base panel assembly 22, with pointed protrusions or knobs 40 and 42 of flange walls 36 and 38, respectively, extending towards each other.

Side channel members 72' and 72" and bottom channel member 74 are the same as top channel member 30, and all of the side walls of those members have pointed protrusions or knobs 64 and 66 extending from the facing surfaces of the side walls.

In some embodiments of this invention, bottom channel member 74 can bear or be replaced by a gasket member to seal the interface between base panel assembly 22 and top panel assembly 24.

Like panel 32, panel 76 is a flat panel that is air impervious and has thermal capability. One example of panel 76 is a multiwall polycarbonate panel.

Top channel member 70, side channel members 72' and 72" and bottom channel member 74 abut at their respective ends to form a "frame" for panel 76. Panel 76 is retained by top channel member 70, side channel members 72' and 72" and bottom channel member 74, i.e., in the "frame," by having (1) its bottom edge retained between pointed protrusions or knobs 66 and 68 of side walls 62 and 64, respectively, of bottom channel member 74, as shown in FIG. 8B, (2) its side edges retained between pointed protrusions or knobs 66 and 68 of side walls 62 and 64, respectively, of side channel members 72' and 72", as also shown in FIG. 8B, and (3) its top edge retained between pointed protrusions or knobs 40 and 42 of flange walls 36 and 38, respectively, of top channel member 70, as shown in FIG. 7B.

Top panel assembly 24 is slidable in the up/down direction relative to base panel assembly 22, as follows. Side channel members 72' and 72" of top panel assembly 24 are slidably received between fingers 56 and 58 of middle flange wall 48 and outer flange wall 50, respectively, of side channel members 28' and 28" of base panel assembly 22, as shown in FIG. 9B, such that top panel assembly 24 can be slid in the up/down direction between at least its extended position illustrated in FIGS. 1, 4 and 5 and its lowered or retracted position illustrated in FIG. 3.

While, in this embodiment of the invention, top panel assembly 24 is comprised of top channel member 70, side channel members 72' and 72" and bottom channel member 74, the top panel assemblies of other embodiments of this invention can include other structural members, as long as those structural members have sufficient structural integrity.

Also, while, in this embodiment of the invention, top channel member 70, side channel members 72' and 72" and bottom channel member 74 are retained in the "frame" shape by the frictional engagement of the edges of panel 76 with (1) pointed protrusions or knobs 66 and 68 of side walls 62 and 64, respectively, of bottom channel member 74, (2) pointed protrusions or knobs 66 and 68 of side walls 62 and 64, respectively, of side channel members 72' and 72", and (3) pointed protrusions or knobs 40 and 42 of flange walls 36 and 38, respectively, of top channel member 70, in other embodiments, the respective ends of those members may be connected, for example, by welding.

In use, when expandable blank panel assembly 20 is used to "fill" a blank space in a row of server racks, base wall 34 of base channel member 26 can be attached to an access floor panel or other floor surface. Then, once top panel assembly 24 is in the desired position, such as the extended position illustrated in FIGS. 1, 4, and 5, base wall 34 of top channel member 70 can be attached to a ceiling support member or structure.

In addition, when expandable blank panel assembly 20 is used to "divide" a space above a row of server racks, base wall 34 of base channel member 26 can be attached to the top of a server rack or racks. Then, once top panel assembly 24 is in the desired position, base wall 34 of top channel member 70 can be attached to a ceiling support member or structure.

Figure 10:
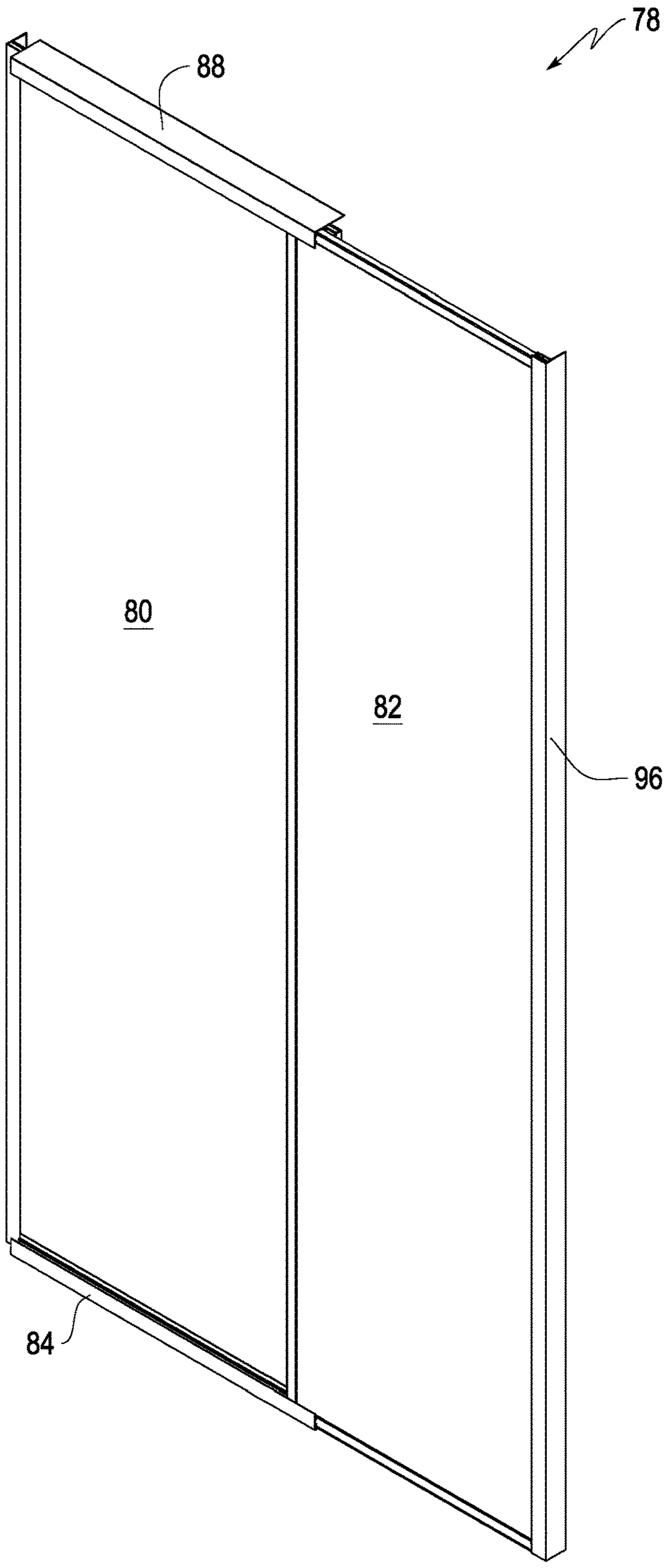
FIG. 10 is a perspective view of an expandable blanking panel assembly of a second embodiment of this invention, illustrating the panel assembly in its extended state.
Figure 11:
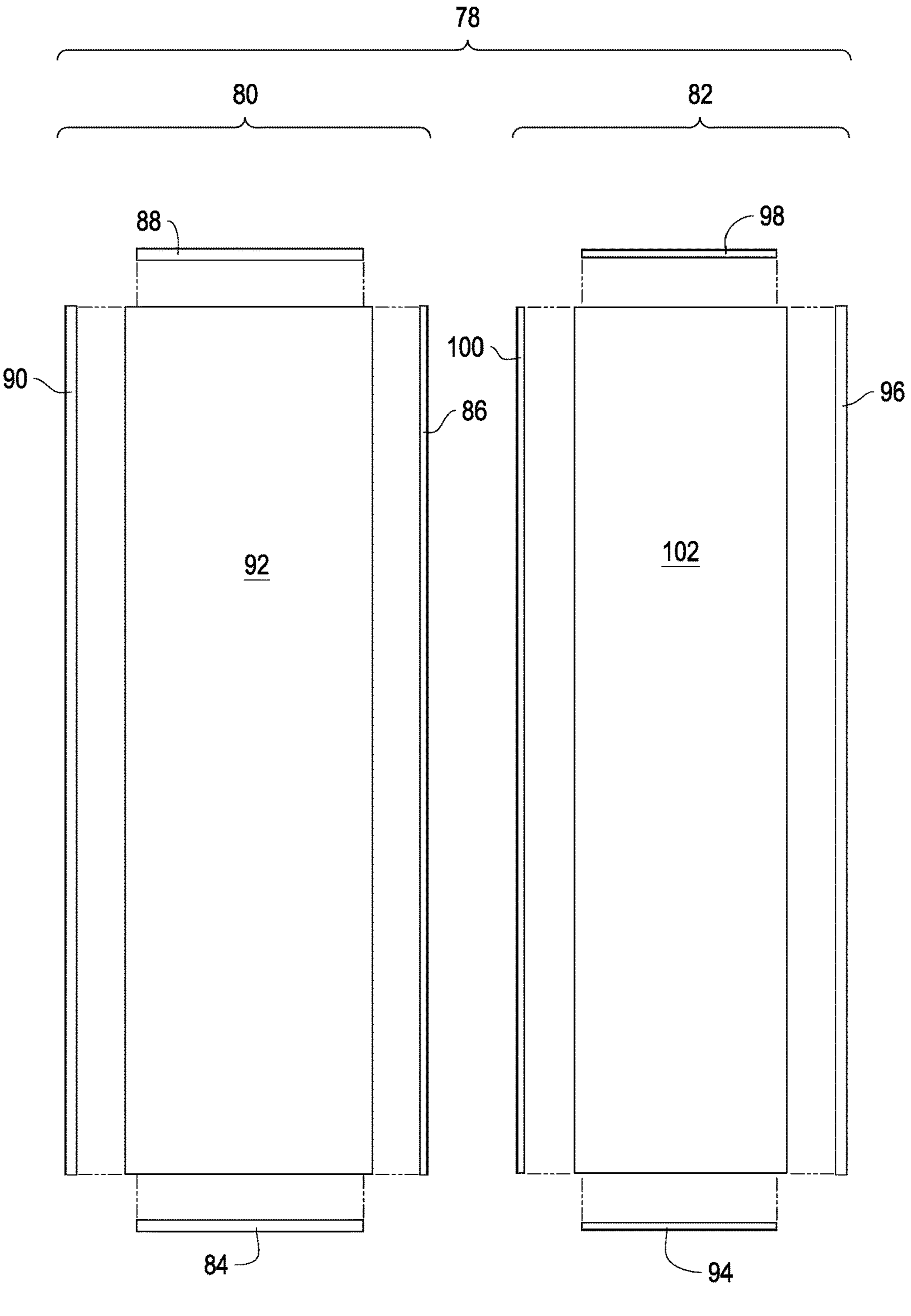
FIG. 11 is a front, exploded view of the expandable blanking panel assembly illustrated in FIG. 10.

A second embodiment of an expandable blanking panel assembly of this invention, expandable blanking panel assembly 78, is illustrated in FIGS. 10 and 11.

In this embodiment, expandable blanking panel 78 includes base panel assembly 80 and slidable panel assembly 82. Slidable panel assembly 82 is slidable in the left/right direction relative to base panel assembly 80 between at least non-extended (retracted) and extended positions, as explained below.

Base panel assembly 80 includes bottom channel member 84, side channel members 86 and 90, top channel member 88 and panel 92, as shown in FIG. 11.

Those members of base panel assembly 80 correspond to the members of base panel assembly 22 of expandable blanking panel assembly 20, as follows. Bottom channel member 84 and top channel member 88 of base panel assembly 80 correspond to side channel members 28' and 28" of base panel assembly 22, respectively, side channel member 86 of base panel assembly 80 corresponds to top channel member 30 of base panel assembly 22, side channel member 90 of base panel assembly 80 corresponds to bottom channel number 26 of base panel assembly 22 and panel 92 of base panel assembly 80 corresponds to panel 32 of base panel assembly 22.

Bottom channel member 84, side channel members 86 and 90 and top channel member 88 abut at their respective ends to form a "frame" for panel 92. Panel 92 is retained by bottom channel member 84, side channel members 86 and 90 and top channel member 88, i.e., in the "frame," by having (1) its bottom edge retained between pointed protrusions or knobs 52 and 54 of inner flange wall 46 and middle flange wall 48, respectively, of bottom channel member 84, (2) one side edge retained between pointed protrusions or knobs 66 and 68 of side walls 62 and 64, respectively, of side channel member 86, (3) its other side edge retained between pointed protrusions or knobs 40 and 42 of flange walls 36 and 38, respectively, of side channel member 90 and (4) its top edge retained between pointed protrusions or knobs 52 and 54 of inner flange wall 46 and middle flange wall 48, respectively, of top channel member 88.

While, in this embodiment of the invention, the "frame" of base panel assembly 80 includes bottom channel member 84, side channel members 86 and 90 and top channel member 88, the base panel assemblies of other embodiments of this invention can include other structural members, as long as those other structural members provide the necessary structural integrity.

Also, while, in this embodiment of the invention, bottom channel member 84, side channel members 86 and 90 and top channel member 88 are retained in the "frame" shape by the frictional engagement of the edges of panel 92 with (1) pointed protrusions or knobs 52 and 54 of inner flange wall 46 and middle flange wall 48, respectively, of bottom channel member 84, (2) pointed protrusions or knobs 66 and 68 of side walls 62 and 64, respectively, of side channel member 86, (3) pointed protrusions or knobs 40 and 42 of flange walls 36 and 38, respectively, of side channel member 90 and (4) pointed protrusions or knobs 52 and 54 of inner flange wall 46 and middle flange wall 48, respectively, of top channel member 88, in other embodiments, the respective ends of those members may be connected, for example, by welding.

In this embodiment of the invention, slidable panel assembly 82 includes bottom channel member 94, side channel members 96 and 100, top channel member 98 and panel 102.

Those members of slidable panel assembly 82 correspond to the members of top panel assembly 24 of expandable panel assembly 20, as follows. Bottom channel member 94 and top channel member 98 of slidable panel assembly 82 correspond to side channel members 72' and 72" of top panel assembly 24, respectively, side channel member 96 of slidable panel assembly 82 corresponds to top channel member 70 of top panel assembly 24, side channel member 100 of slidable channel assembly corresponds to bottom channel member 74 of top panel assembly 24, and panel 102 of slidable panel assembly 82 corresponds to panel 76 of top panel assembly 24.

In some embodiments of this invention, side channel member 100 can bear or be replaced by a gasket member to seal the interface between base panel assembly 80 and slidable panel assembly 82.

Bottom channel member 94, side channel members 96 and 100 and top channel member 98 abut at their respective ends to form a "frame" for panel 102. Panel 102 is retained in the "frame" by having (1) its bottom edge retained between pointed protrusions or knobs 66 and 68 of side walls 62 and 64, respectively, of bottom channel member 94, (2) one side edge retained between pointed protrusions or knobs 40 and 42 of flange walls 36 and 38, respectively, of side channel member 96, (3) the other side edge retained between pointed protrusions or knobs 66 and 68 of side walls 62 and 64, respectively, of side channel member 100 and (4) its top edge retained between pointed protrusions or knobs 66 and 68 of side walls 62 and 64, respectively, of top channel member 98.

While, in this embodiment of the invention, the "frame" of slidable panel assembly 82 includes bottom channel member 94, side channel members 96 and 100 and top channel member 98, the slidable panel assemblies of other embodiments of this invention can include other structural members, as long as those other structural members provide the necessary structural integrity.

Also, while, in this embodiment of the invention, bottom channel member 94, side channel members 96 and 100 and top channel member 98 are retained in the "frame" shape by the frictional engagement of the edges of panel 102 with (1) pointed protrusions or knobs 66 and 68 of side walls 62 and 64, respectively, of bottom channel member 94, (2) pointed protrusions or knobs 40 and 42 of flange walls 36 and 38, respectively, of side channel member 96, (3) pointed protrusions or knobs 66 and 86 of side walls 62 and 64, respectively, of side channel member 100 and (4) pointed protrusions or knobs 66 and 68 of side walls 62 and 64, respectively, of top channel member 98, in other embodiments, the respective ends of those members may be connected, for example, by welding.

Slidable panel assembly 82 is slidable in the left-right direction relative to base panel assembly 80, as follows. Bottom channel member 94 and top channel member 98 of slidable panel assembly 82 are slidably received between fingers 56 and 58 of middle flange wall 48 and outer flange wall 50, respectively, of bottom channel member 84 and top channel member 88 of base panel assembly 80, such that slidable panel assembly 82 can be slid in the left/right direction between at least retracted (non-extended) and extended positions.

In use, when expandable panel assembly 78 is used to "fill" a blank space in a row of server racks, side channel member 90 of base panel assembly 80 can be attached to a a side surface of a server rack or another vertical surface. Then, once slidable panel assembly 82 is in the desired position, side channel member 96 of slidable panel assembly 82 can be attached to a similar opposing surface.

In addition, when expandable panel assembly is used to "divide" a space above a row of server racks, side channel member 90 of base panel assembly 80 can be attached to a vertical surface or member. Then, once slidable panel assembly 82 is in the desired position, side channel member 96 of slidable panel assembly can be attached to another vertical surface or member.

What is described and illustrated herein are embodiments of the invention along with some variations. The terms, descriptions and figures herein are for illustration only and are not meant as limitations. Those skilled in the art will recognize that many variations are possible within the spirit and scope of the invention, which is intended to be defined by the following claims—and their equivalents—in which all terms have their broadest reasonable definitions unless otherwise indicated.

What is claimed is:

1. A panel assembly configured to provide an air barrier in a row of server racks in a data center or similar facility, comprising: a base panel assembly; and a slidable panel assembly, wherein: the base panel assembly and the slidable panel assembly are configured such that the slidable panel assembly can be slid along the base panel assembly between retracted and extended positions; the base panel assembly includes a first air impervious panel, a first base panel channel member and a second base panel channel member; the slidable panel assembly includes a second air impervious panel, a first slidable panel channel member and a second slidable panel channel member; the first base panel channel member has first and second channels; an edge of the first air impervious panel is retained in the first channel; an edge of the second air impervious panel is retained between knobs of the first slidable panel channel member; the slidable panel assembly is slidably retained in the second channel; the second base panel channel member is configured to be attached to a member or structure of the data center or similar facility; and the second slidable panel channel member is configured to be attached to another member or structure of the data center or similar facility; the first base panel channel member and the second base panel channel member are perpendicular; and the first slidable panel channel member and the second slidable panel channel member are perpendicular; and the first base panel channel member includes a base wall and outer, middle and inner flange walls that (i) extend from the base wall in a same direction and (ii) are parallel; the first channel is defined by the inner and middle flange walls; and the second channel is defined by the middle and the outer flange walls; and the outer flange wall and the middle flange wall have finger portions that extend toward each other and are configured to slidably engage the first slidable panel channel member.

2. The panel assembly according to claim 1, wherein the first base panel channel member is an integral, one-piece member.

3. The panel assembly according to claim 1, wherein the first channel and the second channel are side-by-side.

4. The panel assembly according to claim 1, wherein:

the second base panel channel member has a first wall that (i) is configured to be attached to the member or structure of the data center or similar facility and (ii) has a first surface that is configured to abut the member or structure of the data center or similar facility;

the second slidable panel channel member has a second wall that (ii) is configured to be attached to the another member or structure of the data center or similar facility and (ii) has a second surface that is configured to abut the another member or structure of the data center or similar facility; and the first surface and the second surface face opposite directions.

* * * * *